US011430642B2

(12) United States Patent
Engelstaedter et al.

(10) Patent No.: US 11,430,642 B2
(45) Date of Patent: Aug. 30, 2022

(54) CONTROLLING MULTIPLE PLASMA PROCESSES

(71) Applicant: TRUMPF Huettinger Sp. z o. o., Zielonka (PL)

(72) Inventors: Jan Peter Engelstaedter, Ebringen (DE); Krzysztof Ruda, Warsaw (PL); Jakub Swiatnicki, Zdunska Wola (PL)

(73) Assignee: TRUMPF Huettinger Sp. Z o. o., Zielonka (PL)

( * ) Notice: Subject to any disclaimer, the term of this patent is extended or adjusted under 35 U.S.C. 154(b) by 335 days.

(21) Appl. No.: 16/664,174

(22) Filed: Oct. 25, 2019

(65) Prior Publication Data

US 2020/0066497 A1   Feb. 27, 2020

Related U.S. Application Data

(63) Continuation of application No. PCT/EP2018/060939, filed on Apr. 27, 2018.

(30) Foreign Application Priority Data

Apr. 27, 2017   (EP) ..................................... 17168573

(51) Int. Cl.
*H01J 37/32* (2006.01)
*H02M 3/335* (2006.01)
(Continued)

(52) U.S. Cl.
CPC .. *H01J 37/32889* (2013.01); *H01J 37/32899* (2013.01); *H02M 3/33569* (2013.01);
(Continued)

(58) Field of Classification Search
CPC ................. H01J 37/32899; H01J 37/34; H01J 2237/334; H01J 2237/332; H02M 1/0003;
(Continued)

(56) References Cited

U.S. PATENT DOCUMENTS 5,082,546 A   1/1992   Szczyrbowski et al.
5,430,639 A * 7/1995   Takahashi ........... H02M 1/4216
                                                   363/124
(Continued)

FOREIGN PATENT DOCUMENTS

CN       1863428       11/2006
CN      102027154       4/2011
(Continued)

OTHER PUBLICATIONS

CN Office Action in Chinese Appln. No. 201880040374.2, dated Aug. 11, 2021, 5 pages (with English translation).
(Continued)

*Primary Examiner* — Yuechuan Yu
(74) *Attorney, Agent, or Firm* — Fish & Richardson P.C.

(57) ABSTRACT

A power converter is capable to convert an electrical input power into a bipolar output power and to deliver the bipolar output power to at least two independent plasma processing chambers. The power converter includes a power input port for connection to an electrical power delivering grid, at least two power output ports each for connection to one of the plasma processing chambers, and a controller configured to control the power converter to deliver the bipolar output power to the power output ports, using at least one of control parameters including power, voltage, current, excitation frequency, and threshold for protective measures. The controller includes a virtual power supply for each power output port, and each virtual power supply includes a separate complete set of all fixed and time varying parameters and internal states associated with the operation of the individual power output port.

17 Claims, 5 Drawing Sheets

(51) Int. Cl.
| | |
|---|---|
| *C23C 14/54* | (2006.01) |
| *C23C 16/52* | (2006.01) |
| *H02M 7/06* | (2006.01) |
| *H02M 7/5387* | (2007.01) |
| *H02M 1/00* | (2006.01) |
| *H02M 5/458* | (2006.01) |

(52) U.S. Cl.
CPC .............. *C23C 14/54* (2013.01); *C23C 16/52* (2013.01); *H01J 2237/332* (2013.01); *H01J 2237/334* (2013.01); *H01J 2237/3321* (2013.01); *H02M 1/008* (2021.05); *H02M 5/458* (2013.01); *H02M 7/06* (2013.01); *H02M 7/5387* (2013.01)

(58) Field of Classification Search
CPC .... H02M 1/32; H02M 3/33569; H02M 5/458; H02M 7/06; H02M 7/5387; H02M 1/008; Y02E 60/60; C23C 16/52; C23C 16/50; C23C 14/54; H02J 3/36
See application file for complete search history.

(56) References Cited

U.S. PATENT DOCUMENTS

| | | | |
|---|---|---|---|
| 5,777,863 A | 7/1998 | Kowalevskii et al. | |
| 6,096,174 A | 8/2000 | Teschner et al. | |
| 6,271,053 B1 | 8/2001 | Kondo | |
| 6,340,416 B1 | 1/2002 | Goedicke et al. | |
| 6,495,392 B2 | 12/2002 | Sakai et al. | |
| 6,620,299 B1 | 9/2003 | Fietzke et al. | |
| 6,756,318 B2 | 6/2004 | Nguyen et al. | |
| 7,396,759 B1 | 7/2008 | van Schravendijk et al. | |
| 2005/0034667 A1 | 2/2005 | Tsuji et al. | |
| 2006/0156979 A1 | 7/2006 | Thakur et al. | |
| 2007/0045111 A1 | 3/2007 | Trusch et al. | |
| 2011/0036707 A1 | 2/2011 | Horishita et al. | |
| 2014/0357064 A1 | 12/2014 | Fox et al. | |

FOREIGN PATENT DOCUMENTS

| | | | |
|---|---|---|---|
| DE | 4138793 | 5/1993 | |
| DE | 197 02 187 | 7/1998 | .............. H01J 37/34 |
| GB | 9414387 | 2/1995 | |
| JP | 2009280890 | 12/2009 | |
| KR | 2009126993 A | * 12/2009 | |

OTHER PUBLICATIONS

The European Search Report for European Application No. EP 17 16 8573 dated Sep. 29, 2017.
The International Search Report and Written Opinion of the International Searching Authority for International Application No. PCT/EP2018/060939 dated Jul. 16, 2018.

* cited by examiner

CONTROLLING MULTIPLE PLASMA PROCESSES

CROSS REFERENCE TO RELATED APPLICATIONS

This application is a continuation of and claims priority under 35 U.S.C. § 120 from PCT Application No. PCT/EP2018/060939 filed on Apr. 27, 2018, which claims priority from European Patent Application No. 17 168 573.8, filed on Apr. 27, 2017. The entire contents of each of these priority applications are incorporated herein by reference.

TECHNICAL FIELD

The invention is directed to a power converter, a plasma processing system and a method of controlling multiple plasma processes.

BACKGROUND

Many plasma processing systems employ multiple independent plasma processing chambers where plasma processing is performed in parallel.

Such plasma process system is known from US 2014/0357064A1, US 2006/0156979A1, US2005/0034667A1, U.S. Pat. No. 7,396,759B1, U.S. Pat. No. 6,756,318B2, U.S. Pat. No. 6,495,392B2, U.S. Pat. No. 6,271,053B1. To this purpose these systems employ multiple independent power supplies connected to the individual chambers. In many instances the power delivered to all chambers is always less than the sum of the rated power installed on the machine through all independent power supplies. This excess in installed power creates high installation cost.

SUMMARY

One aspect of the invention features a power converter, which is capable to convert an electrical input power into a bipolar output power and to deliver the bipolar output power to at least two independent plasma processing chambers. The power converter comprises:
  one power input port for connection to an electrical power delivering grid,
  at least two, preferably more than two, power output ports, each for connection to one of the plasma process chambers,
  a controller configured to control the power converter to deliver the bipolar output power to the power output ports, using at least one of control parameters including: power, voltage, current, excitation frequency, and threshold for protective measures, such that at least one of the control parameters at a first power output port is different from the corresponding control parameter at a different power output port. In this way one single power converter with a given maximum power capability may be used instead of multiple power converters.

"bipolar output power" in the present disclosure means an output power with an alternating current, where the current changes its direction with a frequency which may excite the plasma process (excitation frequency).

Control parameters may be measured values or set values of the mentioned parameters.

The measured and set values may be absolute, actual, effective such as root mean square (rms), or extreme such as maximum or minimum values.

The input power may be an electrical power delivered from an AC power grid. It may be also a DC power line.

The controller may comprise a microcontroller with a software program running on it when the power converter is in use.

The controller may have multiple interfaces, such as data connections to external components, monitors, keyboards, connectable with wires or wireless.

The controller may have a computing part and a memory part. The memory part may be divided for multiple purposes such as monitor memory, ram, data memory, and program memory.

A threshold value may be a value used for detecting ignition or breakdown of the plasma. It may be specified for each output port differently and changing in time.

The bipolar output power may be a power value more than 1 kW, preferably more than 10 kW.

The bipolar output power may be of a frequency more than 1 kHz, preferably more than 10 kHz, preferably more than 50 kHz.

In a further aspect, the power converter may comprise a first power converter stage configured to convert the input power to an intermediate power, preferable to DC link power.

In a further aspect, the power converter may comprise at least one further power converter stage configured to convert the intermediate power from the first power converter stage to the bipolar output power.

In a further aspect, the power converter may comprise at least two further power converter stages configured to convert the intermediate power from the first power converter stage to multiple bipolar output power signals and lead these bipolar output power signals to the power output ports.

In a further aspect, the power converter may comprise a switching circuitry between the power converter stage(s) and the output ports. The switching circuitry can include one or more switches each connected to a respective output port.

In a further aspect, the switching circuitry is controlled by the controller. Switches to switch between electrodes in only one plasma chamber may be embodied as described in U.S. Pat. No. 6,620,299 B1.

In a further aspect, the controller may be configured to control the power converter stages and/or the switching circuitry such that, in use, the power converter delivers at a first time a first output power signal at the first output power port for a first time frame and at a second time a second power signal at the second output power port for a second time frame, where the first time is different from the second time and/or the first time frame is different from the second time frame.

In a further aspect, the switches are configured to lead current into two opposite directions.

In a further aspect, the controller may be configured to activate a switch from a closed status into an open status only when the absolute value of current through the switch is lower than a current threshold, for example, one ampere, preferably zero.

In a further aspect, the controller may be configured to activate a switch from an open status into a closed status only when the absolute value of voltage along the open switch is lower than a voltage threshold, for example, 20 volts, preferably zero.

In a further aspect, at least one of the power converter stages comprises a bridge circuit, preferably a full bridge circuit.

One bridge circuit may be a rectifier bridge circuit capable of rectifying an AC power.

One bridge circuit may be a bipolar output power generating switching bridge circuit.

In a further aspect, the power converter may comprise a cabinet encompassing all other parts of the power converter.

In a further aspect, the input port may be directly connected to the cabinet.

In a further aspect, the output ports may be directly connected to the cabinet.

Another aspect of the invention features a plasma processing system with two, preferably more than two, plasma processing chambers, and one electrical power converter as described above.

Each plasma processing chamber may be connected to one of the power output ports of the power converter.

In a further aspect, at least one of the plasma processing chambers, preferably all plasma processing chambers, may be configured to process, in use, a plasma vapor deposition (PVD) process.

At least one of the plasma processing chambers, preferably all plasma processing chambers may be configured to process, in use, a plasma enhanced chemical vapor deposition (PECVD) process.

At least one of the plasma processing chambers, preferably all plasma processing chambers, may be configured to process, in use, an atomic layer deposition (ALD) process.

At least one of the plasma processing chambers, preferably all plasma processing chambers, may be configured to process, in use a plasma etching process.

A further aspect of the invention features a method of controlling multiple plasma processes in multiple plasma processing chambers with a controller by converting an electrical input power into a bipolar output power and delivering the bipolar output power to the plasma processing chambers, where the controller controls a power converter to deliver the bipolar output power to the power output ports, using at least one of control parameters including: power, voltage, current, excitation frequency, and threshold for protective measures, by establishing a virtual power supply for every output port, every virtual power supply comprising a separate complete set of all fixed and time varying parameters and internal states associated with the operation of every individual output port that is kept in the controller.

In a further aspect of the method, the controller controls a power converter such that at least one of the control parameters at a first plasma chamber is different from the corresponding control parameter at a different plasma chamber.

In a further aspect of the method, the full set of desired values for the control parameters may be obtained via an interface connection, preferable from a controller external from the power converter, where this external controller also controls the plasma process in the plasma chambers.

In a further aspect of the method, the calculation may comprise the calculation of the maximum desired power at all times and the comparison to the maximum power rating of the power converter.

In a further aspect of the method, an error message may be given, in the case that the outcome of the calculation is, that there is no way of possible delivery the desired value to every for the output ports.

In a further aspect of the method, may be given one or more options of changing the process with a new set of desired values in the case that the outcome of the calculation is, that there is no way of possible delivery the desired value to every for the output ports.

In a further aspect of the method, the controller may control the power converter such that at least one of the control parameters at a first plasma chamber is different from the corresponding control parameter at a different plasma chamber.

Plasma processes in the different plasma chambers may be different or the same. They may be the same but in a different status, which means for example plasma process in a first plasma chamber is in a PECVD status where plasma process in another plasma chamber at the beginning cleaning status, and the same PECVD status will be worked later, when plasma process in a first plasma chamber may be in an etching status. All these processes may be worked out simultaneously or in a time multiplexed manner or in a combination.

The details of one or more embodiments of the invention are set forth in the accompanying drawings and the description below. Other features, objects, and advantages of the invention will be apparent from the description and drawings, and from the claims.

DESCRIPTION OF DRAWINGS

In the figures some examples of the invention are shown schematically and described in more detail in the following description.

DETAILED DESCRIPTION

Figure 1:
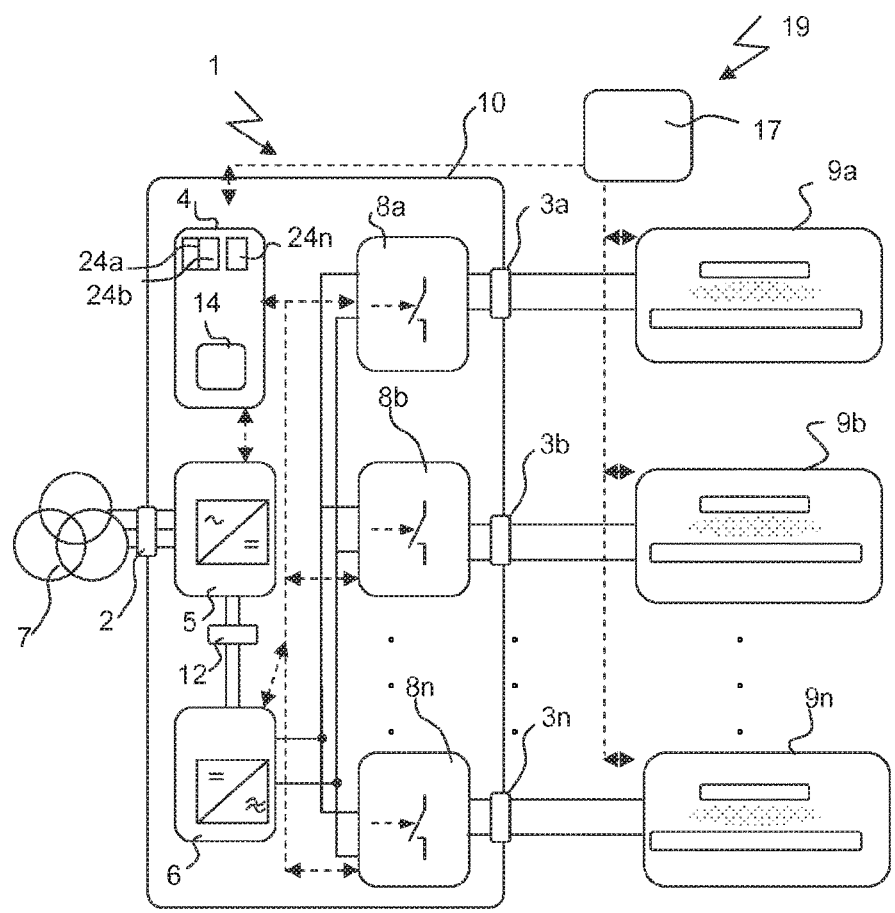
FIG. 1 shows an example of a first plasma processing system with a power converter.

In FIG. 1, a first plasma processing system 19 with a first power converter 1 is shown. The plasma processing system 19 comprises plasma processing chambers 9a, 9b . . . 9n each connected to a respective power output port 3a, 3b, . . . , 3n.

The power converter 1 comprises a power input port 2 for connection to an electrical power delivering grid 7.

The power converter 1 further comprises a first power converter stage 5 configured to convert the input power at the input power port 2 to an intermediate power, preferably to DC link power 12. Also multiple first power converter stages 5 configured to convert the input power at the input power port 2 to an intermediate power, preferably to DC link power 12, may be part of the power converter 1 and, preferably connected in parallel.

The power converter 1 further comprises one further power converter stage 6 connected downstream to the first power converter stage 5 configured to convert the intermediate power from the first power converter stage to the bipolar output power.

In between the power converter stage 5 and the further power converter stage 6 may be implemented an energy storing element such as an inductor or a capacitor for smoothing the current or voltage respectively.

The power converter 1 further comprises a switching circuit including multiple switches 8a, 8b, . . . 8n between the power converter stage 6 and the output ports 3a, 3b, . . . 3n.

The power converter 1 further comprises a controller 4 configured to control the power converter 1 to deliver the bipolar output power to the power output ports 3a, 3b, . . . 3n, using at least one of control parameters including: power, voltage, current, excitation frequency, or threshold for protective measures, such that at least one of the control parameters at a first power output port 3a is different from the corresponding control parameter at a different power output port 3b, . . . 3n.

In this example the controller 4 has connections to the power converter stages 5, 6 and the switches 8a, 8b, . . . 8n. Some of these connections may be optional, for example, the connection to the power converter stages 5. The controller 4 may be configured to activate a switch 8a, 8b, . . . 8n from a closed status into an open status only when the absolute value of current through the switch in the switch is lower than one ampere, preferably zero. This has the advantage that switches which need not to be designed to switch to higher currents may be used. This makes the power converter even less expensive.

The plasma processing system 19 comprises a controller 17 external from the power converter 1. The external controller 17 controls also plasma processes in the plasma chambers 9a, 9b, . . . 9n.

The controller 4 may also be configured to activate a switch 8a, 8b, . . . 8n from an open status into an closed status only when the absolute value of voltage along the open switch is lower than 20 volts, preferably zero. This has the advantage that switches which need not to be designed to switch higher voltages may be used. This makes the power converter even less expensive.

Figure 7:
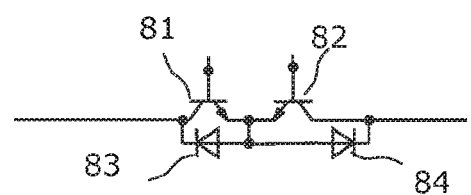
FIG. 7 shows a first embodiment of a switch.
Figure 8:
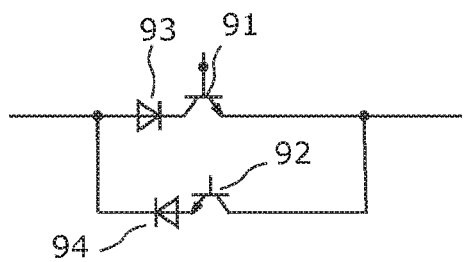
FIG. 8 shows a second embodiment of a switch.

In the example as switches 8a, 8b, . . . , 8n, bipolar transistors 81, 82, 91, 92 are used, as shown in FIGS. 7 and 8. These bipolar transistors are much cheaper than metal-oxide semiconductor field-effect transistors (MOSFETs). The bipolar transistors 81, 82, 91, 92 may be insulated-gate bipolar transistors (IGBTs) that are low cost transistors for leading high currents with low loss of energy. This makes the power converter 1 even less expensive, due to no need of expensive cooling devices.

In FIGS. 7 and 8 additional diodes 83, 84, 93, 94 are connected for leading current into the wanted direction and blocking current into an unwanted direction.

Figure 5:
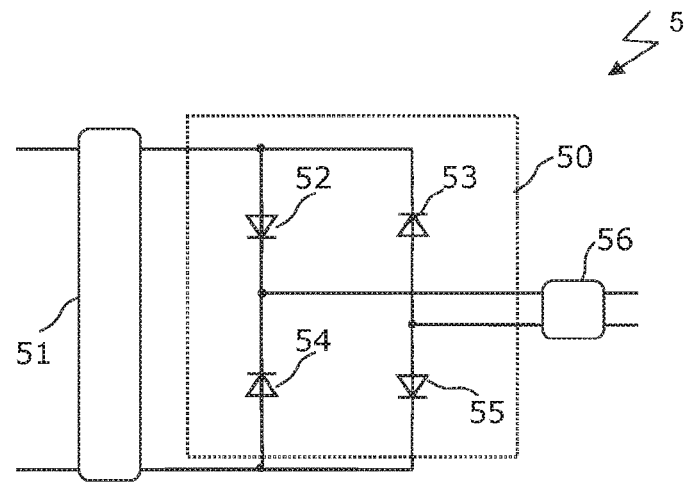
FIG. 5 shows an example of a rectifier bridge circuit.

The first power converter stage 5 may comprise a rectifier circuit, preferably a bridge rectifier circuit 50 as shown in FIG. 5. Four rectifying diodes 52, 53, 54, 55 are connected in a bridge circuit to rectify AC power from the first port 51 to the second port 56. The first port 51 may be additionally connected to at least one of the following: a filter, an overvoltage protection circuit, and an overcurrent protection circuit. A filter may comprise one or more energy saving elements such as capacitors or inductors.

Figure 6:
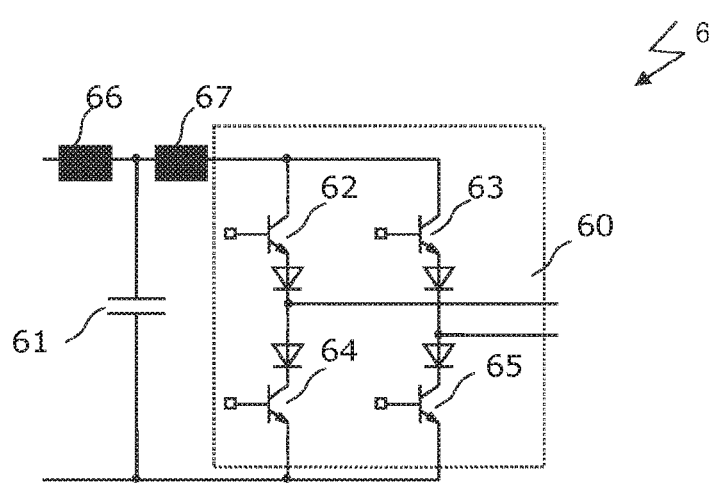
FIG. 6 shows an example of a bipolar power converting bridge.

The second power converter stage 6 may comprise a switching bridge, preferably a full switching bridge 60 as shown in FIG. 6. The full bridge switching bridge 60 comprises four switches 62, 63, 64, 65. These switches may be transistors, bipolar transistors, IGBTs, or most preferably MOSFETs. A filter circuit comprising one or more energy storing elements (or energy saving elements) such as a capacitor 61 and/or inductors 66, 67 may be at the input of the second power converter stage 6. The full bridge switching bridge 60 may further comprise one or more diodes in the shown manner.

The power converter 1 may comprise a cabinet 10 encompassing all other parts of the power converter 1. It may be of metal and therefore a good protection against electromagnetical (EM) disturbing waves. The input port 2 may be directly connected to the cabinet 10. The output ports 3a, 3b, . . . 3n may also be directly connected to the cabinet 10.

In one power converter 1 the current leading capability of all of the switches 8a, 8b . . . 8n together may be higher than the maximum power delivery possibilities of all the power converter stages 5 together.

Figure 2:
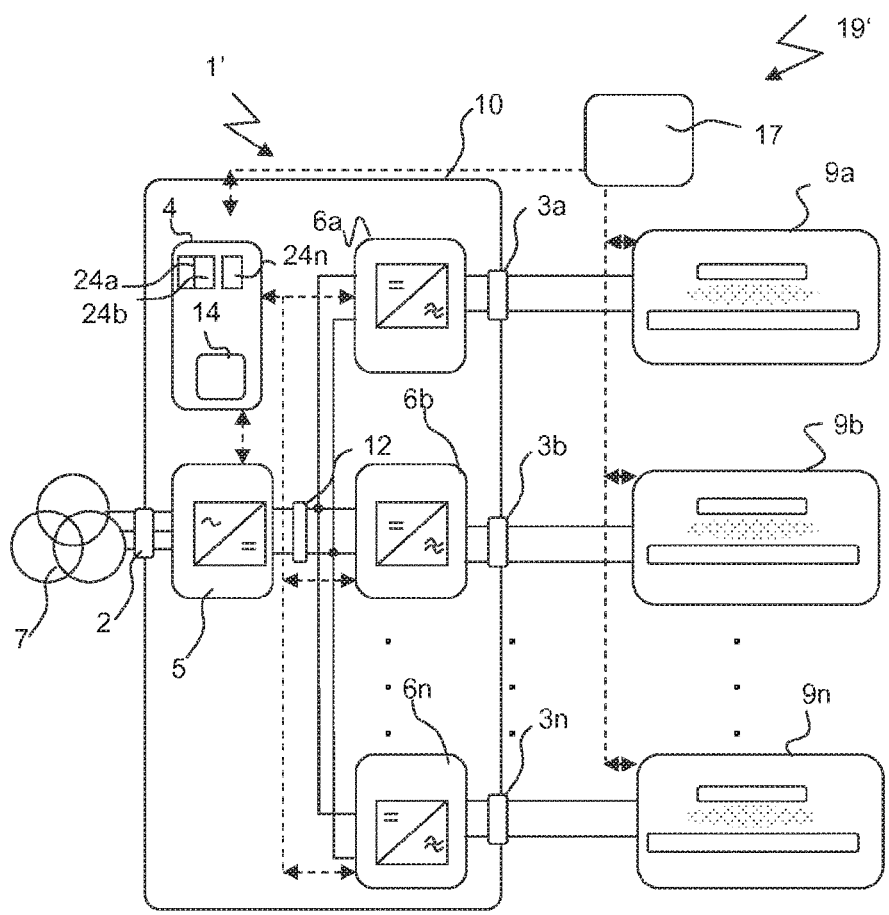
FIG. 2 shows an example of a second plasma processing system with a second power converter.

In FIG. 2 a second plasma processing system 19' with a second power converter 1' is shown. The second power converter 1' is an alternative to the first power converter 1 as shown in FIG. 1. All elements which are the same as in FIG. 1 have the same reference numbers. The power converter 1' as shown in FIG. 2 comprises, instead of the switches 8a, 8b, . . . 8n, multiple power converter stages 6a, 6b, . . . 6n configured to convert the intermediate power 12 from the first power converter stage 5 to multiple bipolar output power signals and lead these powers to the power output ports 3a, 3b . . . 3n. All power converter stages 6a, 6b, . . . 6n are controllable by the controller 4. All power converter stages 6a, 6b, . . . 6n may comprise full bridges 60 and filter elements 61, 66, 67 as shown in FIG. 6.

Measuring sensors for detecting voltage, current, frequency or power may be connected at the output ports 3a, 3b, . . . 3n (not shown).

Also multiple first power converter stages 5 configured to convert the input power at the input power port 2 to an intermediate power, preferably to DC link power 12, may be part of the power converter 1 and, preferably connected in parallel.

Figure 3:
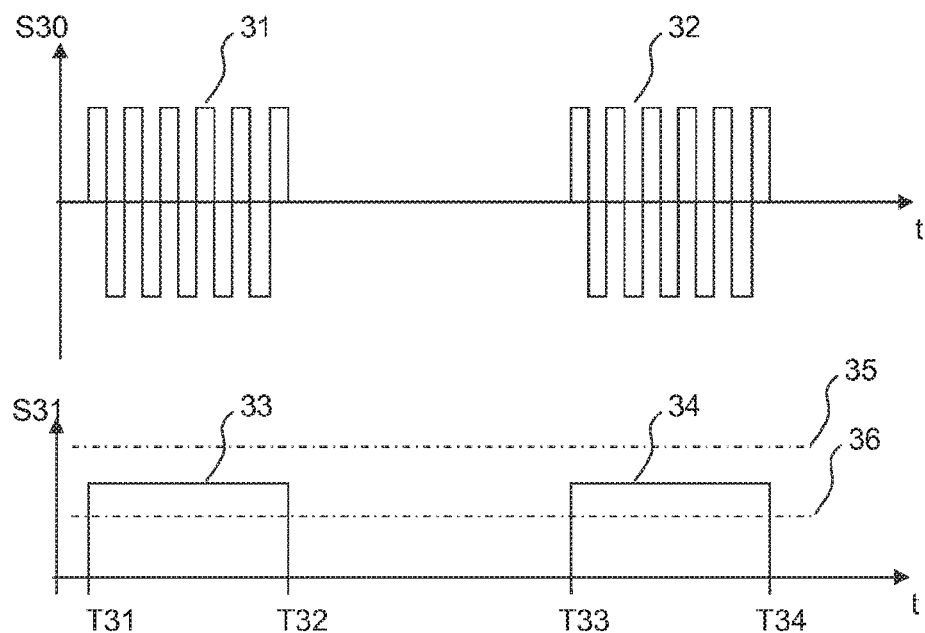
FIG. 3 shows timing diagrams of an output power at a first output power port.

FIG. 3 shows a timing diagram of output power at a first output power port 3a. The axis t is the time axis and the axis S30 may be for example the voltage, current or power axis. As the axis S30 is for the actual values of these parameters, the axis S31 is for an effective value of these parameters. In the first diagram of FIG. 3 with the S30 axis the bipolar signal is shown in two signal sequences 31, 32. The signal sequence 31 has an excitation frequency with a period of $2/11$ of the time frame which begins at time point T31 and ends at time point T32. The signal sequence 32 has an excitation frequency with a period of $2/11$ of the time frame which begins at time point T33 and ends at time point T34. In this example these frequencies are the same, but it is possible that these frequencies may be different. In the second diagram of FIG. 3 with the S31 axis the effective values of the two signal sequences 31, 32 are shown in two signal sequences 33, 34. Two threshold lines 35, 36 are also shown in this diagram. They may be used to detect a plasma breakdown such as an arc or an ignition of the plasma, when the effective value of one of the parameters power, voltage or current exceeds such a threshold. For example, if the signal sequence 33 is a current, the line 35 can be an arc detecting threshold line and the line 36 can be an ignition detecting threshold line. If the signal sequence 33 is a voltage, the line 36 can be an arc detecting threshold line, and an ignition detecting threshold line is not shown here. Line 35 has no specific meaning in this case.

In one power converter 1' the current leading capability of all of the power converter stages 6a, 6b, 6n together may be higher than the maximum power delivery possibilities of all the power converter stages 5 together.

Figure 4:
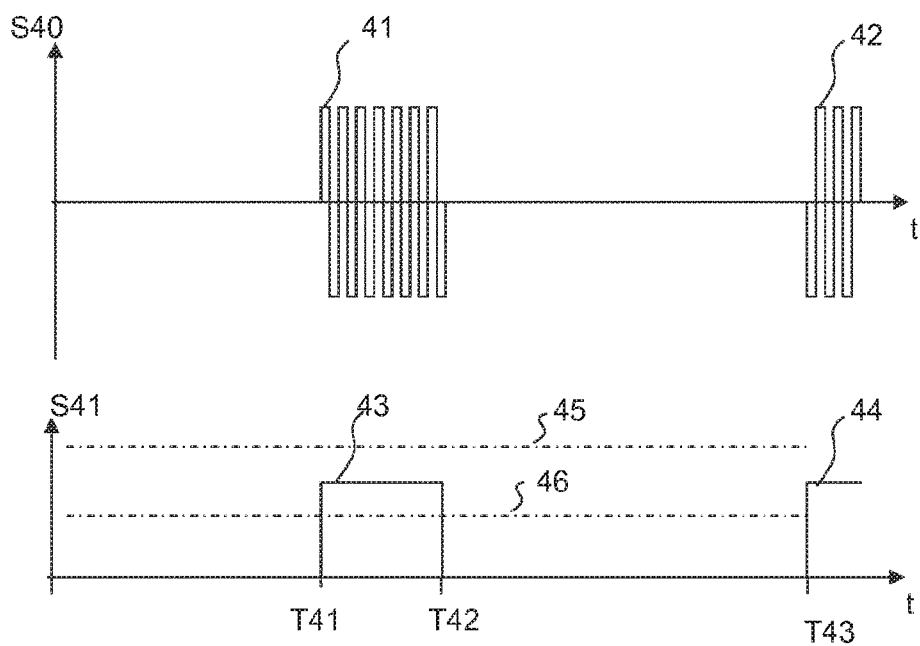
FIG. 4 shows timing diagrams of an output power at a second output power port.

FIG. 4 shows a timing diagram of output power at a different output power port 3b, . . . 3n. The axis t is the time axis and the axis S40 may be for example the voltage, current or power axis. As the axis S40 is for the actual values of these parameters, the axis S41 is for an effective value of these parameters. In the first diagram of FIG. 4 with the S40 axis the bipolar signal is shown in two signal sequences 41, 42. The signal sequence 41 has an excitation frequency with a period of ½ of the time frame which begins at time point T41 and ends at time point T42. At time point T43 a second pulse 44 starts the end of which cannot be seen in this diagram. It may be seen out of this example that the frequencies of the signals 31, 32 and the signals 41, 42 are different, and the frequency of the signals 41, 42 is higher than the frequency of the signals 31, 32.

Additionally or alternatively to the excitation frequency, power, voltage, current, or threshold for protective measures may be different between two different output ports 3a, 3b, . . . 3n or at two different plasma chambers 9a, 9b, . . . 9n.

Two threshold lines 45, 46 are also shown in this diagram. They may be used to detect a plasma breakdown such as an arc or an ignition of the plasma, when the effective value of one of the parameters power, voltage or current exceeds such a threshold.

Various aspects of the invention work in a way of controlling multiple plasma processes in the multiple plasma processing chambers 9a, 9b, . . . 9n with the controller 4 by converting an electrical input power into a bipolar output power as shown in the signal sequences 31, 32, 41, 42 and deliver the output power to the plasma processing chambers 9a, 9b . . . 9n. The controller 4 controls the power converter 1 to deliver the bipolar output power to the power output ports 3a, 3b, . . . 3n, using control parameters of at least one of: power, voltage, current, excitation frequency, or threshold for protective measures.

For that the controller 4 may control the power converter stages 6, 6a, 6b, . . . 0.6n and/or the switches 8a, 8b, . . . 8n such that, in use, the power converter 1 delivers at a first time T31 a first output power signal at the first output power port 3a for a first time frame T31-T32 and at a second time T41 a second power signal at a second output power port 3b, . . . 3n for a second time frame T41-T42, where the first time T31, T41 is different from the second time T32, T42 and/or the first time frame T31-T32 is different from the second time frame T41-T42.

The controller 4 comprises virtual power supplies 24a, 24b, . . . 24n. For the power converter 19 of FIG. 1, where the output power from one central converter stage 5,6 is routed to different output ports 3a, 3b, . . . 3n in turn, the plasma processes driven from the different output ports 3a, 3b, . . . 3n will in the general case impose different operating points in terms of power, impedance etc. With the use of virtual power supplies 24a, 24b, . . . 24n a separate complete set of all fixed and time varying parameters and internal states associated with the operation of every individual output port 3a, 3b, . . . 3n is kept in the controller 4. This means, for example, that when the active output port is switched from 3a to 3b, the controller 4 reinstates from memory the regulation state as it was present when the output power was last switched away from output 3b. This also means for example, that for a power supply with N outputs, there will be N individual sets of arc management parameters, or N sets of pulse frequency and duty cycle settings as controlled and synchronized by a sequence controller 14.

In some cases, the full set of desired values for the complete set of all fixed and time varying parameters and the internal states, may be obtained via an interface connection, for example, from the external controller 17 external from the power converter 19.

The sequence controller 14 is part of the controller 4. Its algorithm determines for every request to the power converter 1 to deliver output power to any of its output ports, or for a request to change one or more parameters of the output ports, whether this request lies in the possible area of operation. For a process as shown in FIGS. 3 and 4 with power delivered to output ports 3a, 3b, . . . 3n, where the different output ports 3a, 3b, . . . 3n are driven with different power levels, different pulse duty cycles and different pulse frequencies, the sequence controller 14 ensures that:

the pulse frequencies are integer multiples of each other, to avoid pulse overlaps (for plasma system 19' like in FIG. 2), for overlapping pulses the total requested output power and current do not exceed the possible maximum (for plasma system 19' like in FIG. 2), if possible maximums are exceeded at a limited period in the cycle, a pattern is found without this limitation if possible (for plasma system 19' like in FIG. 2), the sum of the pulse on times plus the time to switch between outputs is smaller than the lowest frequency pulse cycle time (for plasma system 19 like in FIG. 1), a newly requested output pulse pattern on a particular output is activated at an appropriate time to fit into the pre existing active pulse pattern on the other outputs (for plasma system 19 like in FIG. 1), overall average power and current limits are not exceeded, a warning is issued to the user if the requested sequence is outside the possible area, and a possible modified sequence is recommended to the user.

A number of embodiments of the invention have been described. Nevertheless, it will be understood that various modifications may be made without departing from the spirit and scope of the invention. Accordingly, other embodiments are within the scope of the following claims.

What is claimed is:

1. A power converter configured to convert an electrical input power into a bipolar output power and to deliver the bipolar output power to at least two independent plasma processing chambers, the power converter comprising:
a power input port configured to be connected to an electrical power delivering grid and to receive the electrical input power from the electrical power delivering grid;
at least two power output ports each configured to be connected to a respective one of the plasma processing chambers and output a respective output power to the respective one of the plasma processing chambers, the respective output power being associated with the bipolar output power; and
a controller configured to control delivering the bipolar output power to the power output ports to obtain the respective output powers, using at least one control parameter selected from a list comprising power, voltage, current, excitation frequency, and protection threshold,
wherein the controller comprises a respective virtual power supply for each of the power output ports, the respective virtual power supply comprising a separate complete set of fixed and time varying parameters and internal states associated with an operation of the power output port.

2. The power converter of claim 1, further comprising:
a first power converter stage configured to convert the input power to an intermediate power.

3. The power converter of claim 2, further comprising:
at least one further power converter stage configured to convert the intermediate power from the first power converter stage to the bipolar output power.

4. The power converter of claim 3, further comprising:
a switching circuitry between the at least one further power converter stage and the power output ports.

5. The power converter of claim 4, wherein the switching circuitry is controlled by the controller.

6. The power converter of claim 5, wherein the controller is configured to control the further power converter stage and the switching circuitry, such that, in operation, the further power converter stage delivers at a first time a first output power signal to a first output power port for a first time frame and at a second time a second output power signal to a second output power port for a second time frame, and
wherein the first time is different from the second time and the first time frame is different from the second time frame.

7. The power converter of claim 4, wherein the switching circuit comprises at least two switches each connected to a respective one of the power output ports.

8. The power converter of claim 7, wherein the controller is configured to activate at least one of the switches from a closed status into an open status when an absolute value of current through the switch is lower than a current threshold.

9. The power converter of claim 7, wherein the controller is configured to activate at least one of the switches from an open status into a closed status when an absolute value of voltage along the switch is lower than a voltage threshold.

10. The power converter of claim 3, where the further power converter stage comprises a switching bridge.

11. The power converter of claim 2, where the first power converter stage comprises a bridge circuit.

12. The power converter of claim 2, further comprising at least two further power converter stages configured to:
convert the intermediate power from the first power converter stage to multiple bipolar output power signals, and
lead the multiple bipolar output power signals to the power output ports,
wherein each of the further power converter stages is connected to a respective power output port of the power output ports.

13. The power converter of claim 12, wherein the controller is configured to control the further power converter stages, such that, in operation, a first further power converter stage delivers at a first time a first bipolar output power signal to a first output power port for a first time frame and a second further power converter stage delivers at a second time a second bipolar power signal to a second output power port for a second time frame, and
wherein the first time is different from the second time and the first time frame is different from the second time frame.

14. The power converter of claim 2, further comprising:
a cabinet encompassing the first power converter stage and one or more additional parts,
wherein the cabinet is configured to directly connect to the input port and the power output ports.

15. A plasma processing system comprising:
at least two independent plasma processing chambers; and
a power converter configured to convert an electrical input power into a bipolar output power and to deliver the bipolar output power to the at least two plasma processing chambers, the power converter comprising:
a power input port configured to be connected to an electrical power delivering grid and to receive the electrical input power from the electrical power delivering grid;
at least two power output ports each configured to be connected to a respective one of the plasma processing chambers and output a respective output power to the respective one of the plasma processing chambers, the respective output power being associated with the bipolar output power; and
a controller configured to control delivering the bipolar output power to the power output ports to obtain the respective output powers, using at least one control parameter selected from a list comprising power, voltage, current, excitation frequency, and protection threshold,
wherein the controller comprises a respective virtual power supply for each of the power output ports, the respective virtual power supply comprising a separate complete set of fixed and time varying parameters and internal states associated with an operation of the power output port.

16. The plasma processing system of claim 15, further comprising:
a second controller external from the power converter and operable to control plasma processes in the plasma processing chambers,
wherein the second controller is configured to provide the complete sets of fixed and time varying parameters and the internal states to the power converter.

17. The plasma processing system of claim 15, wherein at least one of the plasma processing chambers is configured to perform at least one of a PECVD process, a PVD process, an ALD process, or a plasma etching process.

* * * * *